US012789275B2

(12) United States Patent
Yu et al.

(10) Patent No.: US 12,789,275 B2
(45) Date of Patent: Nov. 10, 2026

(54) SOLDERING APPARATUS

(71) Applicant: Samsung Electronics Co., Ltd., Suwon-si (KR)

(72) Inventors: Hohyun Yu, Suwon-si (KR); Junghyun Park, Suwon-si (KR); Taegyu Kang, Suwon-si (KR); Jaeseon Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 19/209,937

(22) Filed: May 16, 2025

(65) Prior Publication Data

US 2026/0097444 A1 Apr. 9, 2026

(30) Foreign Application Priority Data

Sep. 12, 2024 (KR) ........................ 10-2024-0124652

(51) Int. Cl.

*B23K 3/00* (2006.01)
*B23K 3/047* (2006.01)
*B23K 3/08* (2006.01)
*H10W 72/00* (2026.01)

(52) U.S. Cl.

CPC .............. *B23K 3/047* (2013.01); *B23K 3/087* (2013.01); *H10W 72/07141* (2026.01); *H10W 72/07173* (2026.01)

(58) Field of Classification Search

CPC ......... H10W 72/07141; H10W 72/072; H10W 72/07234; H10W 72/07236; H10W 72/07334; H10W 72/07336; B23K 1/0016; B23K 2101/40; B23K 3/087; H05B 3/0047

See application file for complete search history.

(56) References Cited

U.S. PATENT DOCUMENTS

| | | | | |
|---|---|---|---|---|
| 8,853,002 | B2 | 10/2014 | Lin et al. | |
| 10,410,990 | B2 | 9/2019 | Han et al. | |
| 10,497,665 | B2 | 12/2019 | Ahn | |
| 11,355,471 | B2 * | 6/2022 | Huang | H10W 72/0198 |
| 12,041,728 | B2 * | 7/2024 | Rahimi | H05K 1/113 |
| 2007/0222065 | A1 * | 9/2007 | Andry | H10W 46/00 257/E21.705 |

(Continued)

FOREIGN PATENT DOCUMENTS

KR 102652950 B1 4/2024

*Primary Examiner* — Erin B Saad

(74) *Attorney, Agent, or Firm* — Harness, Dickey & Pierce, P.L.C.

(57) ABSTRACT

A soldering apparatus includes a substrate support configured to support a module array substrate, the module array substrate including a plurality of module regions having semiconductor devices arranged therein, each of the plurality of module regions having a connector tab in a side portion thereof, a lamp heater above the substrate support and configured to irradiate light on the module array substrate, and a tab mask on the module array substrate. The tab mask includes an edge portion having an opening that exposes the plurality of module regions of the module array substrate, and the tab mask includes transparent ribs extending within the opening. Each of the transparent ribs covers a corresponding connector tab and is configured to transmit the light therethrough.

20 Claims, 22 Drawing Sheets

(56) References Cited

U.S. PATENT DOCUMENTS

| | | | | |
|---|---|---|---|---|
| 2010/0059782 | A1* | 3/2010 | Fujitomo | H10F 77/50<br>257/E33.056 |
| 2020/0232623 | A1* | 7/2020 | Radl | F21V 7/0066 |
| 2021/0043597 | A1* | 2/2021 | Zhang | H05K 3/3431 |
| 2022/0256698 | A1* | 8/2022 | Zenou | H05K 1/111 |
| 2023/0309242 | A1* | 9/2023 | Simula | H05K 1/0393 |
| 2025/0239563 | A1* | 7/2025 | Min | B23K 1/0016 |

* cited by examiner

10

300

SOLDERING APPARATUS

CROSS-REFERENCE TO RELATED APPLICATION

This U.S. non-provisional application claims priority under 35 U.S.C. § 119 to Korean Patent Application No. 10-2024-0124652, filed on Sep. 12, 2024, in the Korean Intellectual Property Office (KIPO), the contents of which are incorporated herein by reference in their entirety.

BACKGROUND

Example embodiments relate to a soldering apparatus and a soldering method.

A soldering process for mechanically and electrically connecting electronic components to a substrate may use an IPL (Intense Pulsed Light) method which relatively shortens a process time and consumes relatively less power. When heat is applied to the electronic component during the IPL soldering process, a flux component of a solder paste may react with a copper pad component to generate steam, and relatively rapid evaporation of the water may cause the flux to splash around (flux spattering), which may contaminate a connector tab exposed along one side of the substrate. A metal jig may be used to limit or minimize the contamination of the connector tab, but the metal jig may occupy a separate space, and the metal jig may incur maintenance costs. In addition, due to the metal jig, the connector tab may not be illuminated with light, which may cause defects such as insufficient or poor soldering due to thermal gradient, and the vaporized flux may condense on the connector tab, thereby contaminating the connector tab.

SUMMARY

Example embodiments provide a soldering apparatus capable of preventing warpage of a module substrate during a soldering process and reducing, limiting, or minimizing contamination of a connector tab of the module substrate.

According to some example embodiments, a soldering apparatus includes a substrate support configured to support a module array substrate, the module array substrate including a plurality of module regions having semiconductor devices arranged therein, each of the plurality of module regions having a connector tab in a side portion thereof; a lamp heater above the substrate support and configured to irradiate light on the module array substrate; and a tab mask on the module array substrate, the tab mask including an edge portion having an opening that exposes the plurality of module regions of the module array substrate, and the tab mask including transparent ribs extending within the opening, each of the transparent ribs covering a corresponding connector tab and configured to transmit the light therethrough.

According to some example embodiments, a soldering apparatus includes a substrate support configured to support a module array substrate, the module array substrate including a plurality of module regions having semiconductor devices arranged therein and a cutting region dividing the plurality of module regions, and each of the plurality of module regions having a connector tab in a side portion thereof; a lamp heater above the substrate support and configured to irradiate light on the module array substrate; a tab mask on the module array substrate, the tab mask including an edge portion having an opening that exposes at least a portion of the module array substrate, and the tab mask including transparent ribs extending inwardly from the edge portion, each of the transparent ribs covering a corresponding connector tab and configured to transmit the light; and a tab mask driver configured to support the tab mask and raise and lower the tab mask.

According to some example embodiments, a soldering apparatus includes a substrate support configured to support a module array substrate, the module array substrate including a plurality of module regions having semiconductor devices arranged therein and a cutting region dividing the plurality of module regions, each of plurality of module regions having a connector tab in a side portion thereof; a lamp heater above the substrate support and configured to irradiate light on the module array substrate; a tab mask on the module array substrate, the tab mask including an edge portion having an opening that exposes the module regions of the module array substrate, and the tab mask including transparent ribs extending within the opening, each of the transparent ribs covering a corresponding connector tab and configured to transmit the light; a tab mask driver configured to support the tab mask and raise and lower the tab mask; and a light blocking partition in a lower portion of the lamp heater and configured to contact an upper surface of the tab mask to at least partially define a heating chamber for radiant heat transfer.

According to some example embodiments, a soldering apparatus may include a substrate support configured to support a module array substrate having connector tabs, a lamp heater configured to irradiate light on the module array substrate from above the substrate support, and a tab mask disposed on the module array substrate and having an edge portion and transparent ribs, the transparent ribs extending to cover or overlap the connector tabs within the edge portion, and the transparent ribs being configured to transmit the light.

When electronic components disposed on the module array substrate are heated by the irradiation of light, a flux component in a solder paste may react with a copper pad component to generate steam, and the relatively rapid evaporation of the water may cause the flux to splash onto the connector tab. Since the transparent rib of the tab mask covers or overlap the connector tab, the contamination of the connector tab by the flux may be reduced, limited, or minimized.

In addition, since the transparent rib transmits the light, the connector tab under the transparent rib may also be heated by the light. Accordingly, since the temperature of the connector tab also rises in the same or similar manner (or rate) as other substrate parts, it may be possible to reduce, limit, or minimize defects such as cold soldering due to thermal gradient and to reduce, limit, or minimize the vaporized flux from condensing on the connector tab and contaminating the connector tab.

BRIEF DESCRIPTION OF THE DRAWINGS

Example embodiments will be more clearly understood from the following detailed description taken in conjunction with the accompanying drawings.

FIG. 1 is a plan view illustrating a soldering apparatus, according to some example embodiments.

FIG. 2 is a plan view illustrating the soldering apparatus of FIG. 1 with a lamp heater of FIG. 1 omitted.

FIG. 3 is a cross-sectional view taken along the line A-A' in FIG. 1.

FIG. 4 is a cross-sectional view taken along the line B-B' in FIG. 1.

FIG. 5 is a plan view illustrating a module array substrate loaded into the soldering apparatus of FIG. 1.

FIG. 6 is a cross-sectional view taken along the line C-C' in FIG. 5.

FIG. 7 is a plan view illustrating a tab mask, according to some example embodiments.

FIG. 8 is a cross-sectional view taken along the line D-D' in FIG. 7.

FIG. 9 is a plan view illustrating the tab mask of FIG. 7 placed on the module array substrate on a substrate support of FIG. 1.

FIG. 10 is a cross-sectional view illustrating a lamp heater for irradiating light onto the module array substrate of FIG. 9.

FIG. 11 is an enlarged cross-sectional view illustrating portion 'F' in FIG. 10.

FIG. 12 is a plan view illustrating a tab mask, according to some example embodiments.

FIG. 13 is a plan view illustrating the tab mask of FIG. 12 disposed on a module array substrate.

FIGS. 14, 15, 16, 17, 18, 19, 20, 21, and 22 are views illustrating a method of manufacturing an electronic device, according to some example embodiments.

DETAILED DESCRIPTION OF EXAMPLE EMBODIMENTS

Hereinafter, example embodiments will be explained in detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

Hereinafter, the terms "lower portion" and "upper portion" are for convenience of description and do not limit the positional relationship.

As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C," "at least one of A, B, or C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1:
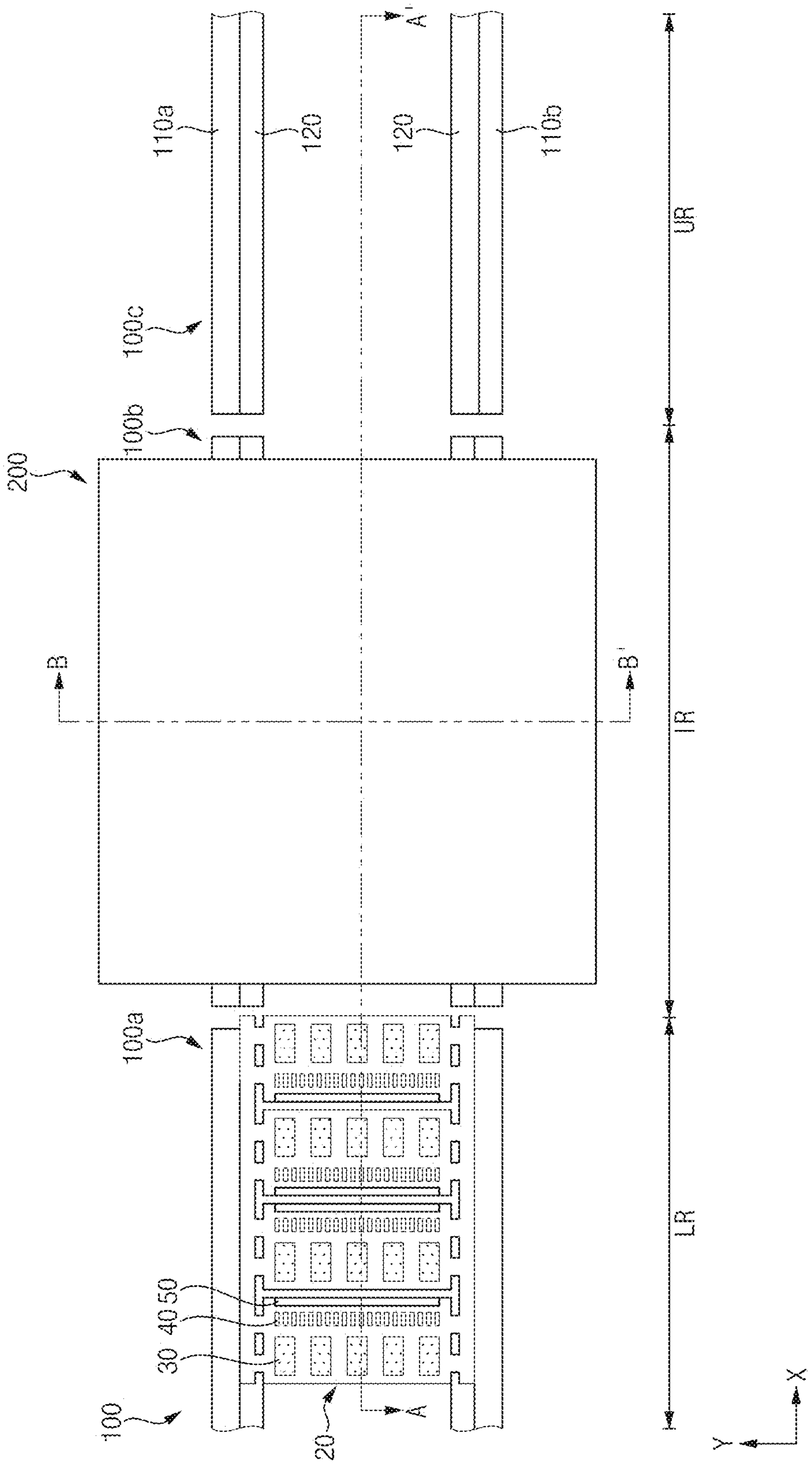
FIGS. 1 to 22 represent non-limiting, example embodiments as described herein.
Figure 2:
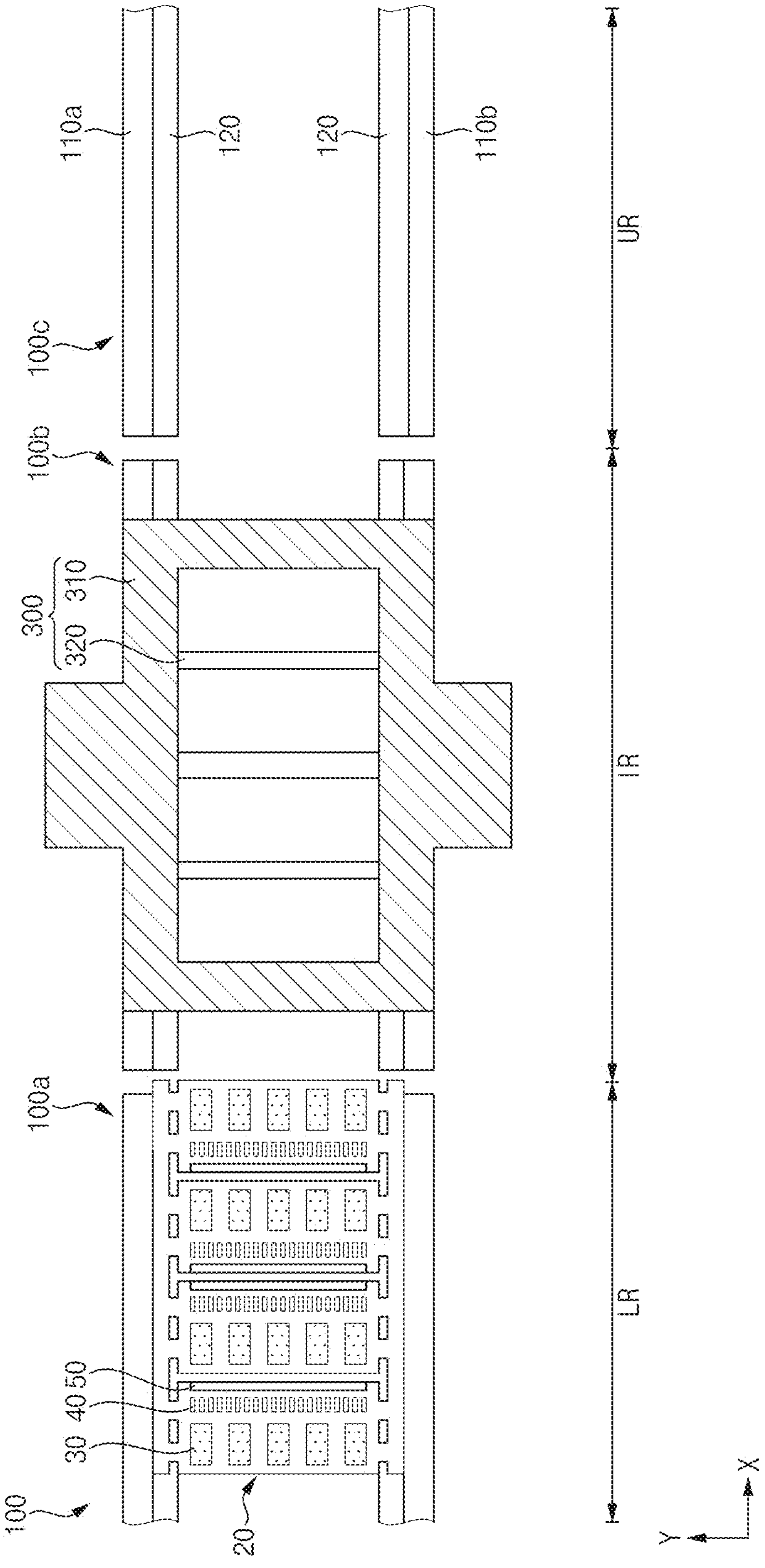
Figure 3:
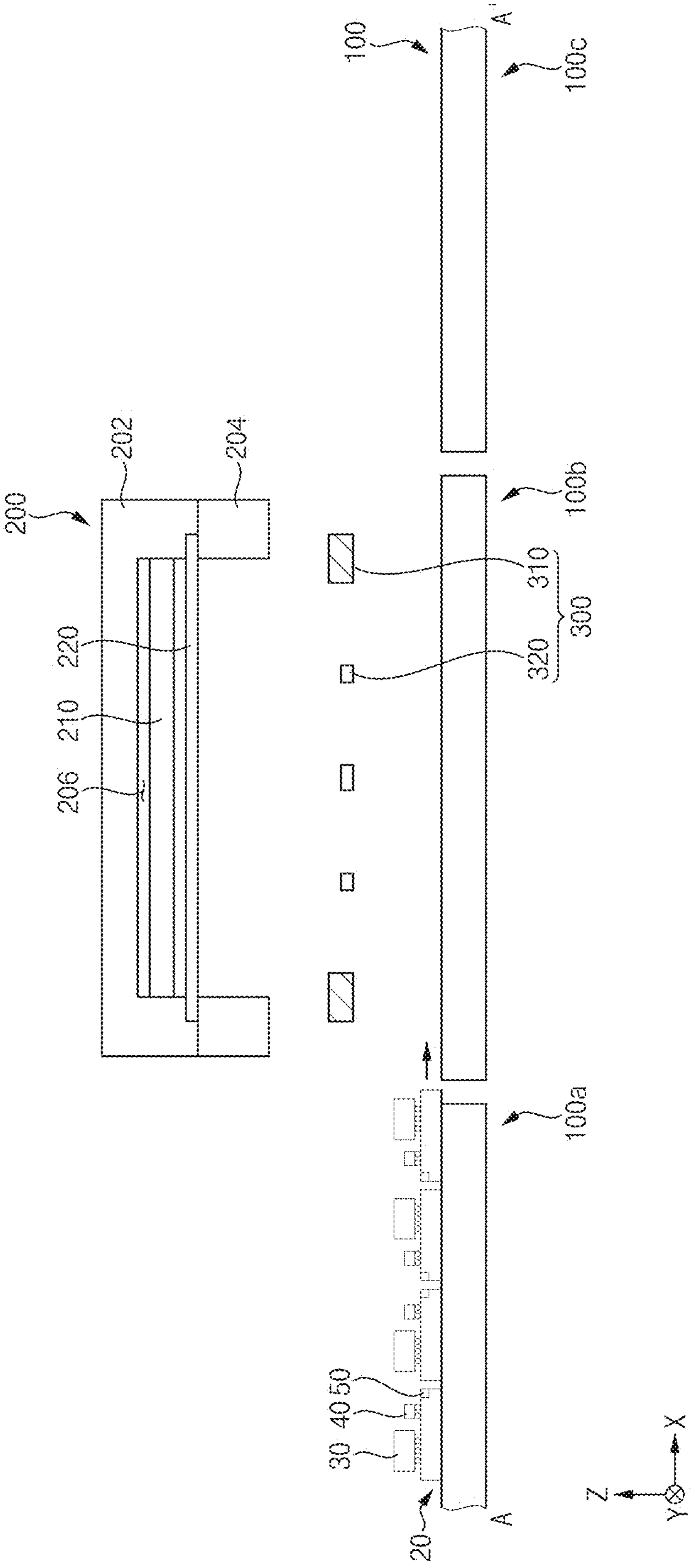
Figure 4:
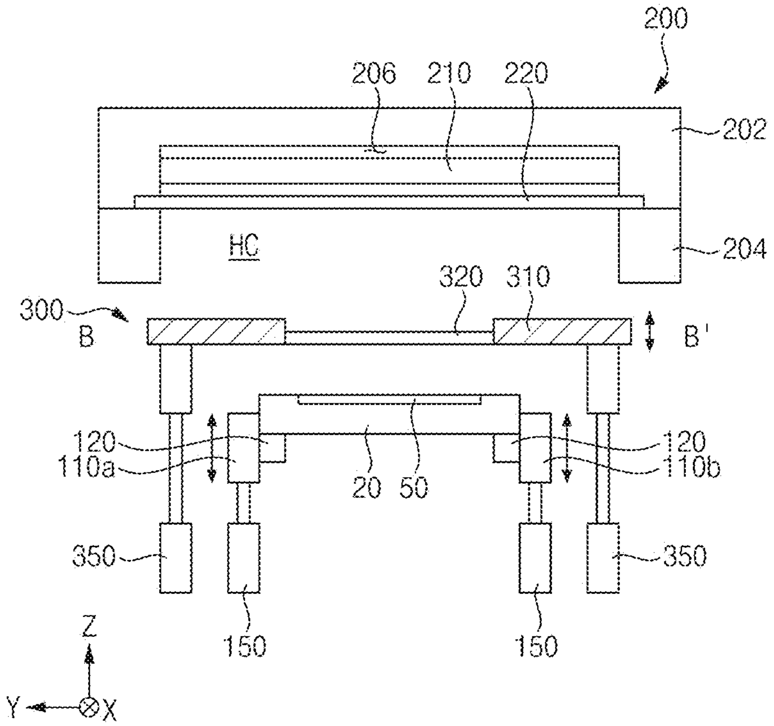
Figure 5:
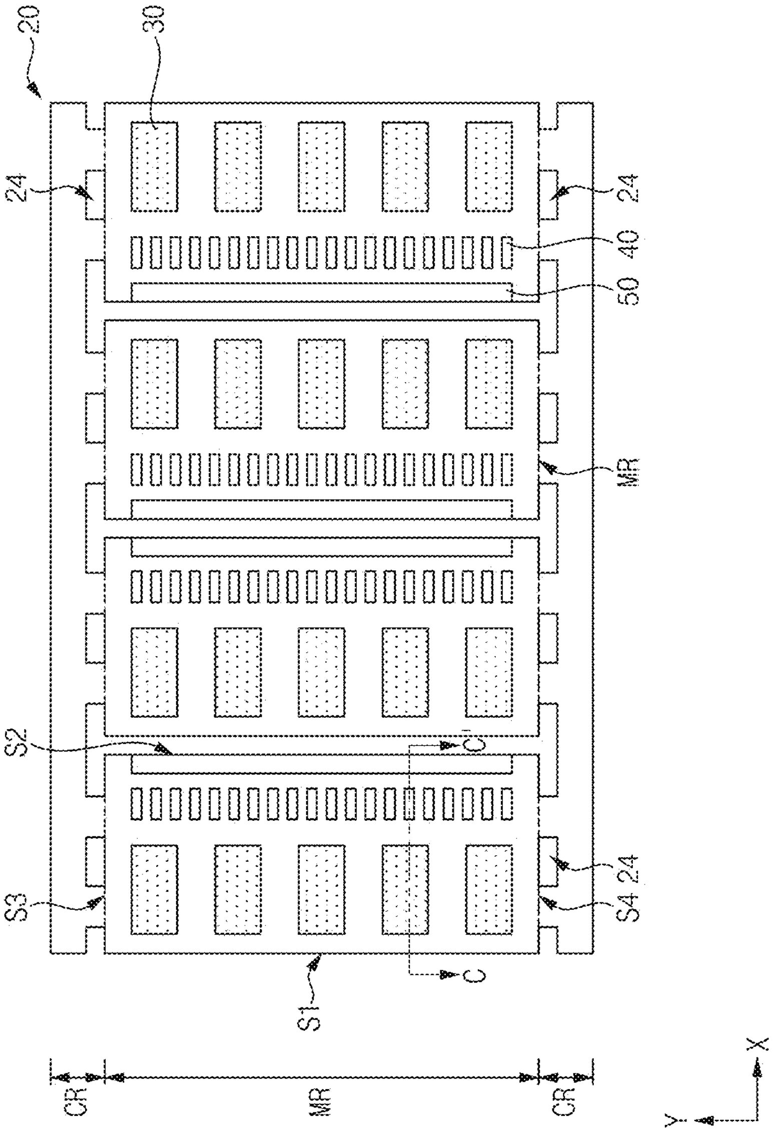
Figure 6:
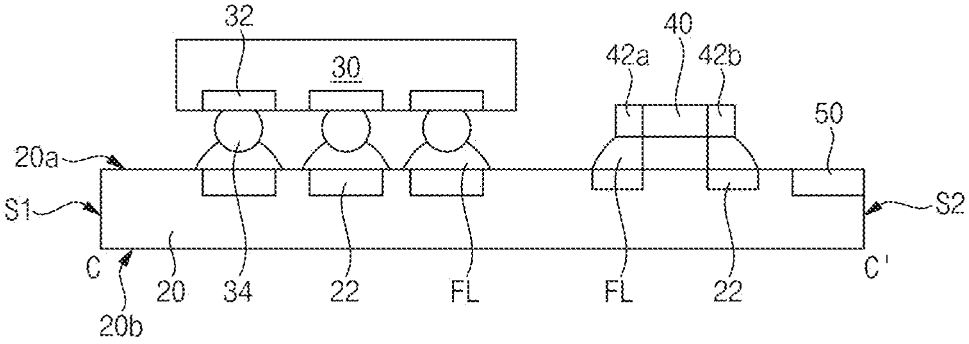
Figure 7:
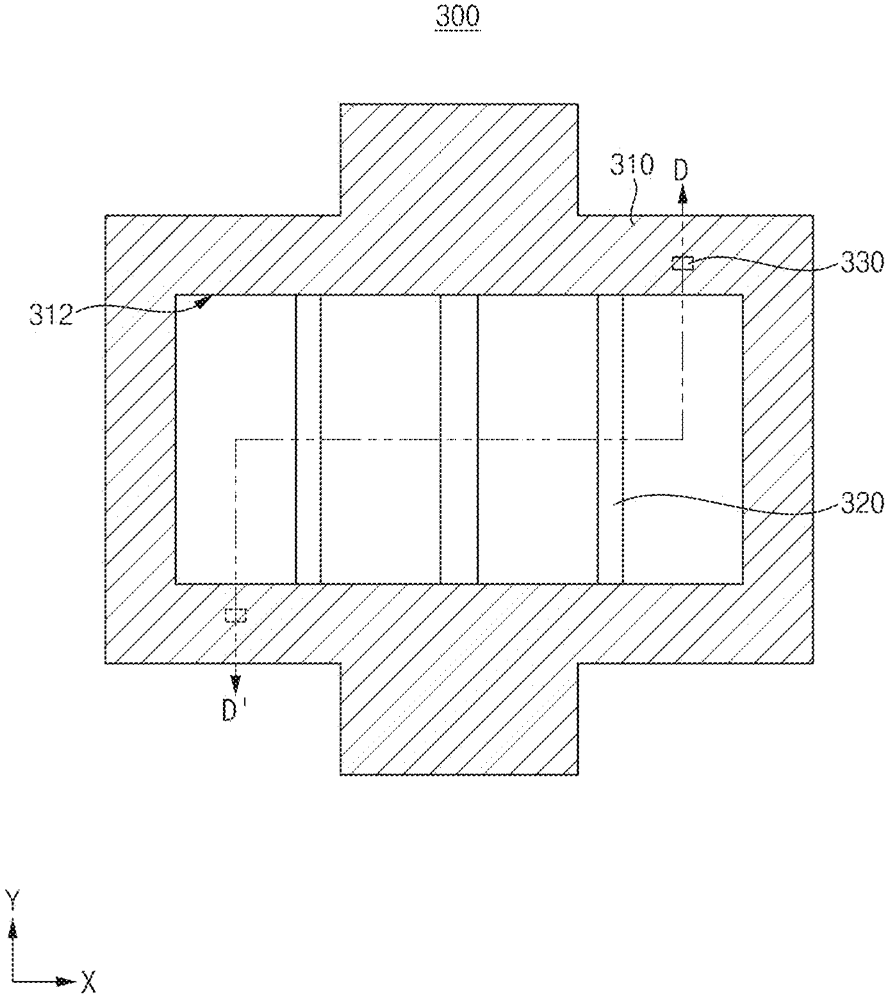
Figure 8:
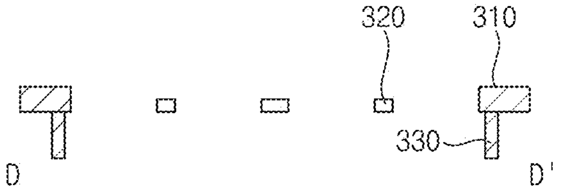
Figure 9:
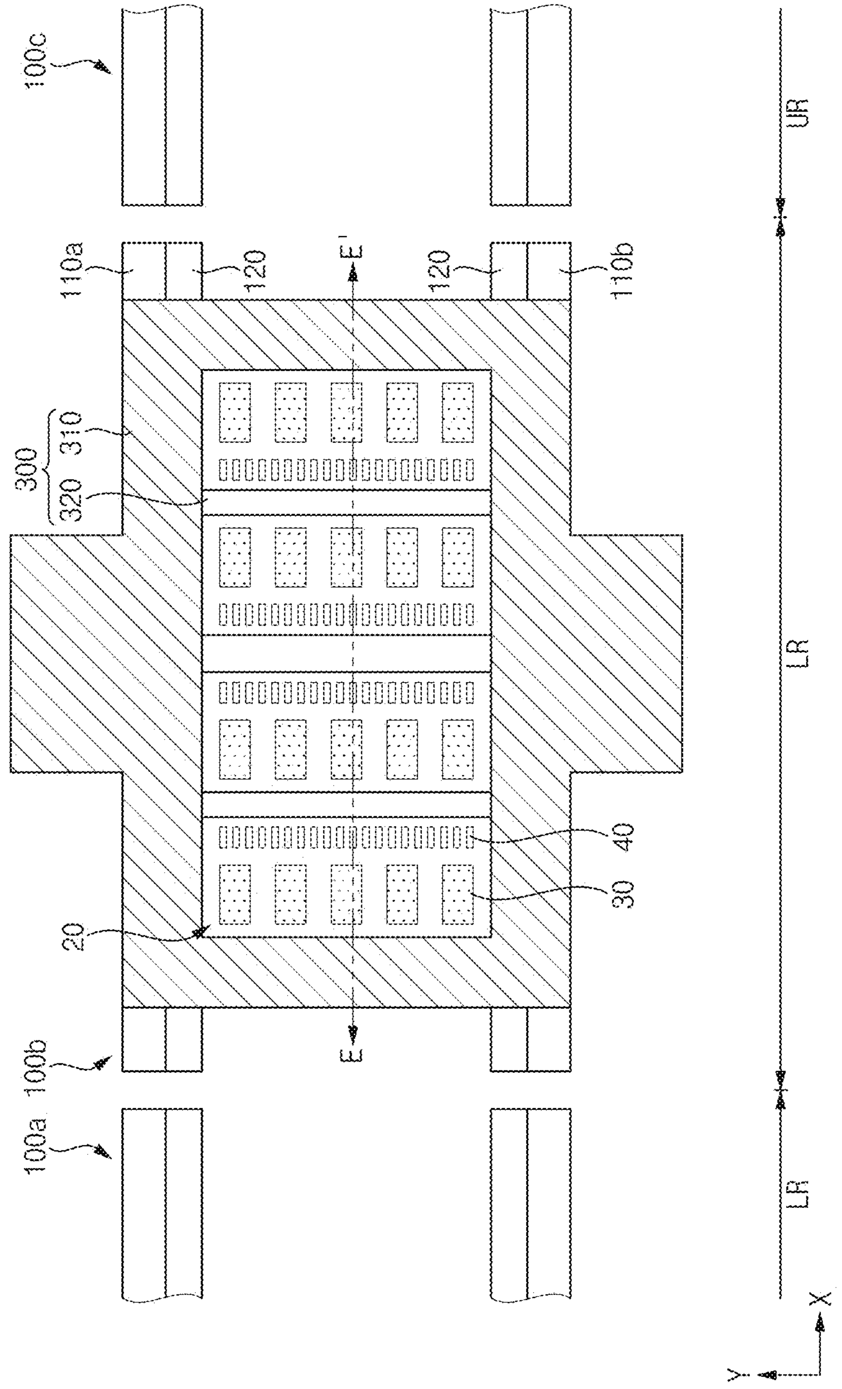
Figure 10:
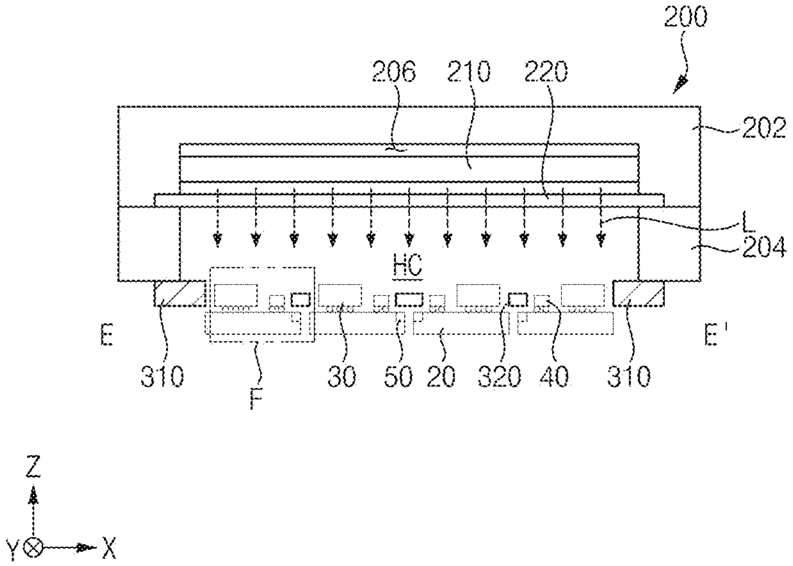
Figure 11:
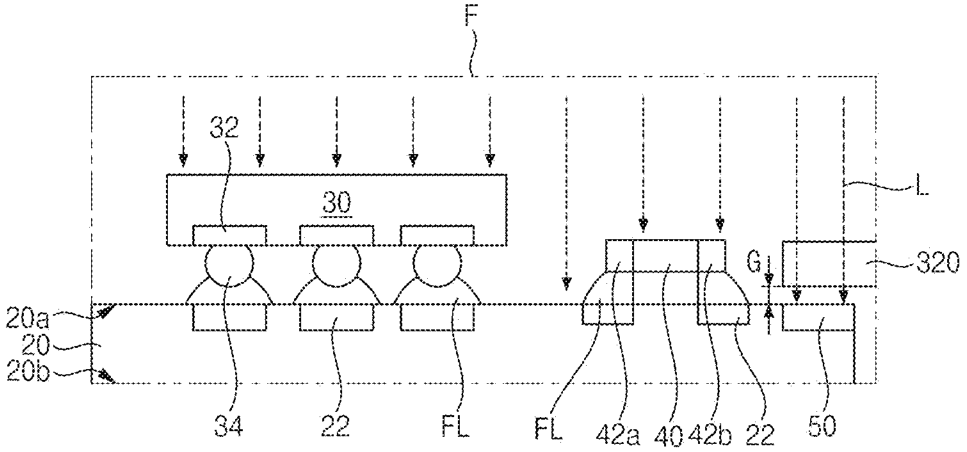

FIG. 1 is a plan view illustrating a soldering apparatus, according to some example embodiments. FIG. 2 is a plan view illustrating the soldering apparatus of FIG. 1 with a lamp heater omitted. FIG. 3 is a cross-sectional view taken along the line A-A' in FIG. 1. FIG. 4 is a cross-sectional view taken along the line B-B' in FIG. 1. FIG. 5 is a plan view illustrating a module array substrate loaded into the soldering apparatus of FIG. 1. FIG. 6 is a cross-sectional view taken along the line C-C' in FIG. 5. FIG. 7 is a plan view illustrating a tab mask, according to some example embodiments. FIG. 8 is a cross-sectional view taken along the line D-D' in FIG. 7. FIG. 9 is a plan view illustrating the tab mask of FIG. 7 placed on the module array substrate on a substrate support of FIG. 1. FIG. 10 is a cross-sectional view illustrating a lamp heater for irradiating light onto the module array substrate of FIG. 9. FIG. 10 includes a cross-section taken along the line E-E' in FIG. 9. FIG. 11 is an enlarged cross-sectional view illustrating portion 'F' in FIG. 10.

Referring to FIGS. 1 to 11, a soldering apparatus 10 may include a substrate support 100, a lamp heater 200, and/or a tab mask 300. In addition, the soldering apparatus 10 may further include a substrate stage driver 150 and/or a tab mask driver 350.

In some example embodiments, the soldering apparatus 10 may be an intense pulsed light (IPL) type soldering apparatus for soldering solder paste by irradiating light onto a module array substrate 20 on which electronic components 30, 40 are arranged. For example, the soldering apparatus 10 may irradiate light onto a module substrate and semiconductor devices arranged via conductive bumps on the module substrate, and heat the solder paste on the conductive bumps to mechanically and electrically connect (or bond) the semiconductor devices to the module substrate.

For the purposes of discussion, a direction in which the light is irradiated may be referred to as the vertical direction (Z direction), and directions perpendicular to the vertical direction (Z direction) and orthogonal to each other may be referred to as a first horizontal direction (X direction) and a second horizontal direction (Y direction).

As illustrated in FIGS. 5 and 6, the module array substrate 20 may be loaded into the soldering apparatus 10 so that a soldering process may be performed. The module array substrate 20 may extend in a first horizontal direction (X direction). The module array substrate 20 may include a plurality of module regions MR arranged in the first horizontal direction (X direction) and a cutting region CR surrounding the module regions MR. Although the plurality of module regions MR have been described as being arranged in a row, example embodiments may not be limited thereto, and the plurality of module regions MR may be arranged in a form of an array forming a plurality of columns and rows. As described below, after the soldering process is performed, the module array substrate 20 may be cut along the cutting region CR into individual semiconductor modules. For example, the semiconductor module may be a solid state drive (SSD) device that may function as a storage device.

The module array substrate 20 may have an upper surface 20*a* and a lower surface 20*b* opposite to the upper surface 20*a*. The module array substrate 20 may have a plurality of substrate pads 22 on the upper surface 20*a*. In addition or alternatively, the module array substrate 20 may include a substrate insulating layer that may cover the upper surface 20*a* and expose the plurality of substrate pads 22.

Each module region MR may have first to fourth side portions S1, S2, S3, S4. For example, the first side portion S1 and the second side portion S2 may extend in the second horizontal direction (Y direction) and face each other. The third side portion S3 and the fourth side portion S4 may extend in the first horizontal direction (X direction) and face each other.

A plurality of electronic components 30, 40 may be arranged on each module region MR of the module array substrate 20. The plurality of electronic components 30, 40 may include a first semiconductor device 30 and second semiconductor device 40. The first semiconductor device 30 may be arranged on the module array substrate 20 via conductive bumps 34. The conductive bumps 34 may be formed on input/output pads 32 of the first semiconductor device 30, respectively. Solder paste FL may be applied on the conductive bumps 34 or the substrate pads 22 of the module array substrate 20. The conductive bumps 34 may be arranged on the substrate pads 22 of the module array substrate 20, respectively.

For example, the first semiconductor device 30 may include a logic chip or a memory device. The logic chip may be a controller that controls memory chips. The first semiconductor device 30 may include a processor chip such as ASIC or an application processor AP as a host, such as CPU, GPU, or SOC. The memory device may include volatile memory devices such as SRAM devices, DRAM devices, etc., and non-volatile memory devices such as flash memory devices, PRAM devices, MRAM devices, RRAM devices, etc.

The second semiconductor device 40 may be placed or arranged on the module array substrate 20 via solder paste FL. The second semiconductor device 40 may include a passive element such as a capacitor or a resistor. For example, the second semiconductor device 40 may include a multi-layer ceramic capacitor (MLCC). First and second connection terminals 42*a*, 42*b* of the second semiconductor device 40 may be electrically connected to the substrate pads 22 of the module array substrate 20 via the solder paste FL.

The module array substrate 20 may include a connector tab 50 for connection with an external device provided in the second side portion S2 of each module region MR. The connector tab 50 may extend in the second horizontal direction (Y direction) along the second side S2 of the module region MR. The connector tab 50 may include a plurality of connection terminals spaced apart along the second horizontal direction (Y direction). A plurality of second semiconductor devices 40 may be spaced apart along the second side portion S2 (e.g., along Y direction) of the module region MR adjacent to the connector tab 50.

As illustrated in FIGS. 1 to 4, the substrate support 100 may move and support the module array substrate 20 along the first horizontal direction (X direction). The substrate support 100 may include first, second, and third transfer portions 100*a*, 100*b*, 100*c* that are sequentially arranged along the first horizontal direction (X direction).

The substrate support 100 may have an irradiation region IR onto which light L may be irradiated, and a loading region LR and an unloading region UR arranged in both (e.g., opposite) sides of the irradiation region IR. The first transfer portion 100*a* may be arranged in the loading region LR and may serve or function as a loading stage on which a module array substrate 20 is loaded. The second transfer portion 100*b* may be arranged in the irradiation region IR and may serve or function as a substrate support stage that supports the module array substrate 20 transferred from the first transfer portion 100*a*. A soldering process using light L may be performed on the module array substrate 20 on the second transfer portion 100*b*. The third transfer portion 100*c* may be arranged in the unloading region UR and may serve or function as an unloading stage for unloading the module array substrate 20 on which the soldering process has been performed.

Each of the first transfer portion 100*a*, the second transfer portion 100*b*, and the third transfer portion 100*c* may include a pair of guide rails 110*a*, 110*b* that extend in the first horizontal direction (X direction) and transfer conveyors 120 that extend along the pair of guide rails 110*a*, 110*b*. The pair of guide rails 110*a*, 110*b* and/or the transfer conveyors 120 mount and/or transfer the module array substrate 20. The transfer conveyors 120 may be a conveyor belt or a conveyor chain.

The substrate stage driver 150 may raise and lower the pair of guide rails 110*a*, 110*b* of the second transfer portion 100*b*. As the pair of guide rails 110*a*, 110*b* raise and lower, the module array substrate 20 placed on the transfer conveyors 120 may also move up and down. The pair of guide rails 110*a*, 110*b* of each of the first transfer portion 100*a*, the second transfer portion 100*b*, and the third transfer portion 100*c* may be connected to each other. In some example embodiments, the substrate stage driver 150 may raise and lower the pair of guide rails 110*a*, 110*b* of the first transfer portion 100*a*, the second transfer portion 100*b*, and the third transfer portion 100*c* that are connected to each other.

In some example embodiments, the lamp heater 200 may include a lamp housing 202 disposed above the second transfer portion 100*b* and defining an accommodation space 206, and a lamp unit 210 disposed within the accommodation space 206 of the lamp housing 202 and configured to irradiate light L onto the module array substrate 20 to apply heat. An opening may be formed or defined at a bottom portion of the lamp housing 202 to emit light L from the lamp unit 210 downward, and a transparent cover member 220 may be provided in the opening. The transparent cover member 220 may cover the opening of the lamp housing 202 to form or define the accommodation space 206.

For example, the lamp heater 200 may be an IPL (Intense Pulsed Light) type optical device that directly applies heat by irradiating light of a relatively broadband wavelength. In some example embodiments, the lamp unit 210 may include a xenon (Xe) lamp. The lamp heater 200 may be a radiation heat transfer type device that transfers heat to a target object by utilizing light of multiple wavelengths generated from the xenon lamp. For example, the lamp heater 200 may be operated in a manner of irradiating light by repeating a first state in which light is irradiated (ON state) and a second state in which light is not irradiated (OFF state) for a relatively shorter time. For example, the time for which light is irradiated by the IPL device may be 1.5 ms (or about 1.5 ms). In addition, the time for which light is not irradiated by the IPL device may be 248 ms (or about 248 ms).

In some example embodiments, the soldering apparatus 10 may further include a light blocking partition 204 provided in a lower portion of the lamp heater 200. The light blocking partition 204 may extend downwardly from a lower sidewall of the lamp housing 202. As described below, the tab mask 300 may be raised to contact the light blocking partition 204. The light blocking partition 204 may be brought into contact with an upper surface of the tab mask 300 to define or form a heating chamber HC for radiant heat transfer.

In some example embodiments, the tab mask 300 may be disposed on the second transfer portion 100*b* below the lamp heater 200. The tab mask 300 may include an edge portion 310 and transparent ribs 320. The edge portion 310 may have an opening 312 that exposes the module regions MR of the module array substrate 20. The transparent ribs 320 may extend within the opening 312. The transparent ribs 320 may extend inwardly from the edge portion 310. For example, the edge portion 310 may include a metal material such as aluminum, stainless steel, etc. The transparent ribs 320 may include a transparent material such as quartz, glass, polyimide film, etc.

The tab mask driver 350 may raise and/or lower the tab mask 300. When the module array substrate 20 is seated or installed on the second transfer portion 100*b*, the tab mask 300 may be lowered so that the edge portion 310 of the tab mask 300 may press (or contact) and fix (or couple to) a peripheral region of the module array substrate 20, for example, the cutting region CR. Then, the pair of guide rails 110*a*, 110*b* and the tab mask 300 may be raised together, and the tab mask 300 may come into contact with the light blocking partition 204 to form the heating chamber HC. The heating chamber HC may be connected to an exhaust port to provide an airflow path for discharging vaporized flux within the heating chamber HC.

As illustrated in FIGS. 7 to 9, the transparent ribs 320 may be spaced apart in the first horizontal direction (X direction). The transparent ribs 320 may extend in the second horizontal direction (Y direction) to cover or overlap the connector tabs 50 of the module array substrate 20, respectively. The extension directions and/or widths of the transparent ribs 320 may be determined based on (or correspond to) the extension direction and/or widths of the connector tabs 50.

The tab mask 300 may extend in one direction from the edge portion 310 and may include an alignment guide member for aligning the module array substrate 20. For example, the alignment guide member may include a guide pin 330. The guide pin 330 may extend in a vertical direction from a lower surface of the edge portion 310. When the module array substrate 20 is seated or installed on the second transfer portion 100*b*, the tab mask 300 may be lowered so that the edge portion 310 of the tab mask 300 may press (or contact) the cutting region CR of the module array substrate 20. The guide pin 330 may be inserted into an alignment hole 24 formed in the cutting region CR of the module array substrate 20. Accordingly, the module array substrate 20 seated or installed on the second transfer portion 100*b* may be aligned by the guide pin 330.

As illustrated in FIGS. 10 and 11, after the module array substrate 20 is seated or installed on the second transfer portion 100*b* within the irradiation region IR, the module array substrate 20 and the tab mask 300 may be raised together, and the edge portion 310 of the tab mask 300 may come into contact with the light blocking partition 204 to form (or at least partially define) the heating chamber HC. Then, the lamp heater 200 may irradiate light L onto the module array substrate 20 to heat the electronic components 30, 40. The transparent rib 320 of the tab mask 300 may cover or overlap the connector tab 50. A distance G between the transparent rib 320 and the corresponding connector tab 50 may be within a range of 0.1 mm (or about 0.1 mm) to 0.6 mm (or about 0.6 mm).

When heat is applied to the electronic component 30, 40 by the irradiation of the light L, a flux component in the solder paste FL may react with a copper pad component to generate water, and the rapid vaporization of the water may cause the flux to splash onto the connector tab 50. Since the transparent rib 320 of the tab mask 300 covers the connector tab 50, contamination of the connector tab 50 by the flux may be reduced, limited, or minimized. When the distance G between the transparent rib 320 and the corresponding connector tab 50 is greater than 0.6 mm (or about 0.6 mm), the vaporized flux may splash onto the connector tab 50.

In addition or alternatively, since the transparent rib 320 may transmit the light L, the connector tab 50 under the transparent rib 320 may also be heated by the light L. Accordingly, since the temperature of the connector tab 50 also rises in a same or similar manner (or rate) as other substrate parts, warpage of the substrate may be reduced, limited, or minimized by the thermal gradient.

As mentioned above, the soldering apparatus 10 may include the substrate support 100 configured to support the module array substrate 20 having the connector tabs 50, the lamp heater 200 configured to irradiate the light L onto the module array substrate 20 from above the substrate support 100, and the tab mask 300 disposed on the module array substrate 20 and having the edge portion 310 and the transparent ribs 320 that extend to cover or overlap the connector tabs 50 within the edge portion 310 and transmit the light L.

When the electronic components 30, 40 disposed on the module array substrate 20 are heated by the irradiation of light L, the flux component in the solder paste FL may react with the copper pad component to generate steam, and the rapid evaporation of the water may cause the flux to splash onto the connector tab 50. Since the transparent rib 320 of the tab mask 300 covers or overlap the connector tab 50, the contamination of the connector tab 50 by the flux may be reduced, limited, or minimized.

In addition, since the transparent rib 320 transmits the light L, the connector tab 50 under the transparent rib 320 may also be heated by the light L. Accordingly, since the temperature of the connector tab 50 may also rise in a same or similar manner or rate as one or more other substrate parts, it may be possible to reduce, limit, or minimize defects such as cold soldering due to thermal gradient and to reduce, limit, or minimize the vaporized flux from condensing on the connector tab 50 and contaminating the connector tab 50.

Figure 12:
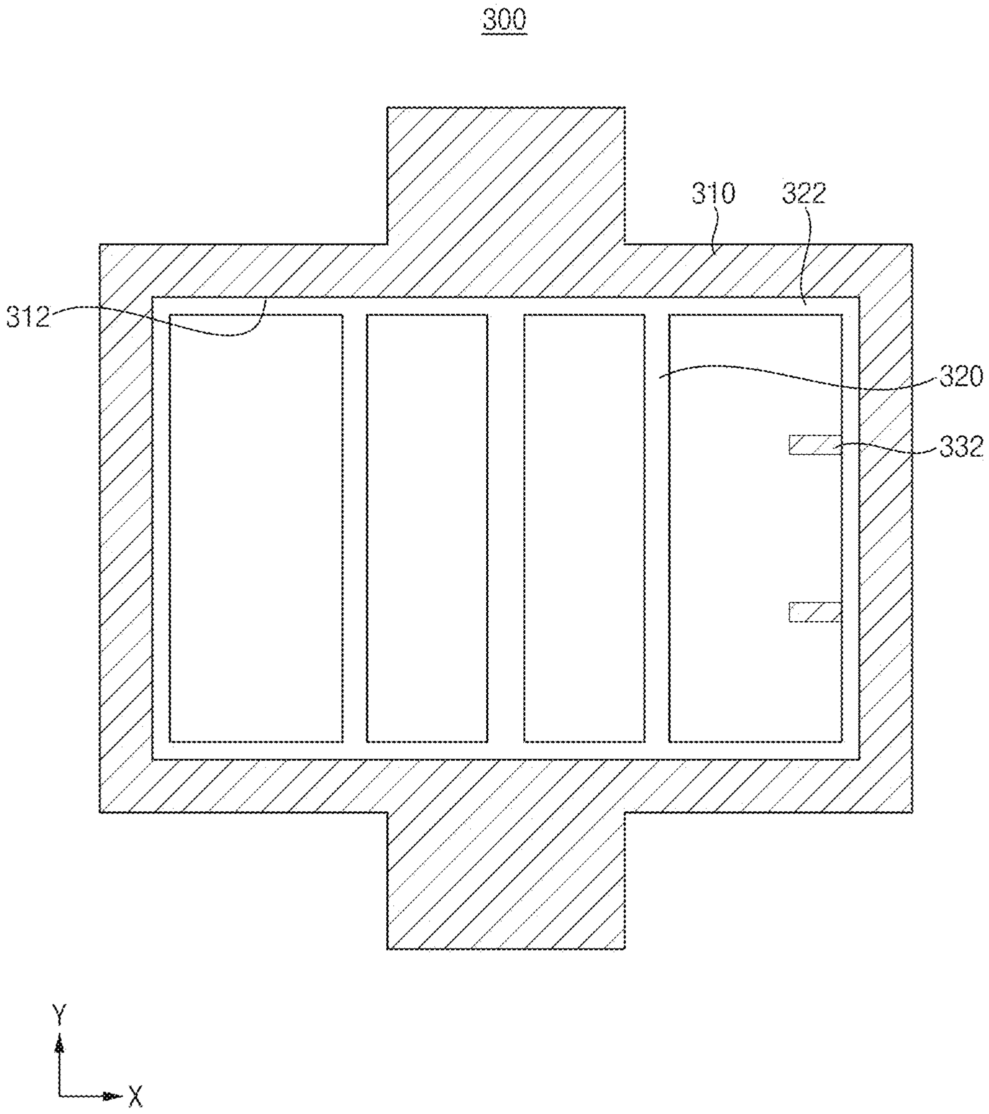
Figure 13:
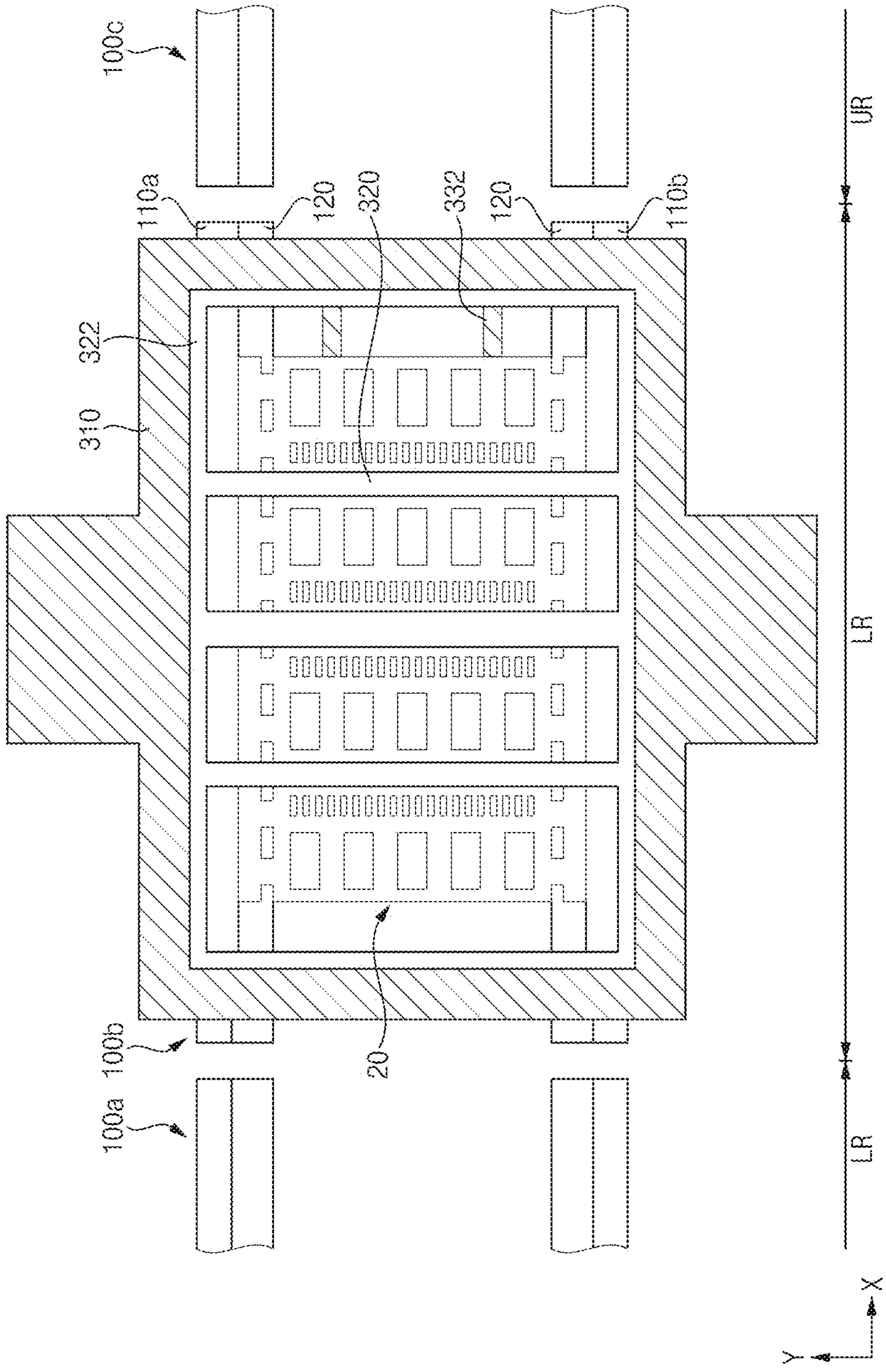

FIG. 12 is a plan view illustrating a tab mask, according to some example embodiments. FIG. 13 is a plan view illustrating the tab mask of FIG. 12 disposed on a module array substrate. The tab mask may be substantially same as or similar to the tab mask of FIG. 7, and therefore may be best understood with reference thereto where like numerals indicate like elements not described again in detail.

Referring to FIGS. 12 and 13, a tab mask 300 may include an edge portion 310 and a rib structure provided in the edge portion 310. The rib structure may include a rib frame 322 installed in an opening 312 of the edge portion 310 and transparent ribs 320 extending inwardly from the rib frame 322. The transparent ribs 320 may be formed integrally with the rib frame 322. The rib frame 322 and the transparent ribs 320 may include transparent materials such as quartz, glass, polyimide film, etc.

The tab mask 300 may include an alignment guide member that extends in one direction from the edge portion 310 and aligns the module array substrate 20. For example, the alignment guide member may include a guide stopper 332. The guide stopper 332 may include a vertical extension extending vertically on a lower surface of the edge portion 310 and a horizontal extension extending from the vertical extension inwardly from the edge portion 310. The opening 312 of the edge portion 310 may have an opening that may expose the entire module array substrate 20 or may expose desired portions of the module array substrate 20.

When the module array substrate 20 is seated or installed on the second transfer portion 100*b*, a right side of the module array substrate 20 may come into contact with the horizontal extension of the guide stopper 332. Accordingly, the module array substrate 20 seated or installed on the second transfer portion 100*b* may be aligned by the guide stopper 332.

Hereinafter, a method of manufacturing an electronic device using the soldering apparatus will be described. The following description considers that the electronic device is a memory module. However, it will be understood that the method of manufacturing an electronic device is not limited to only manufacturing memory modules, and it will be understood that example embodiments are likewise applicable to manufacturing other electronic devices.

Figure 14:
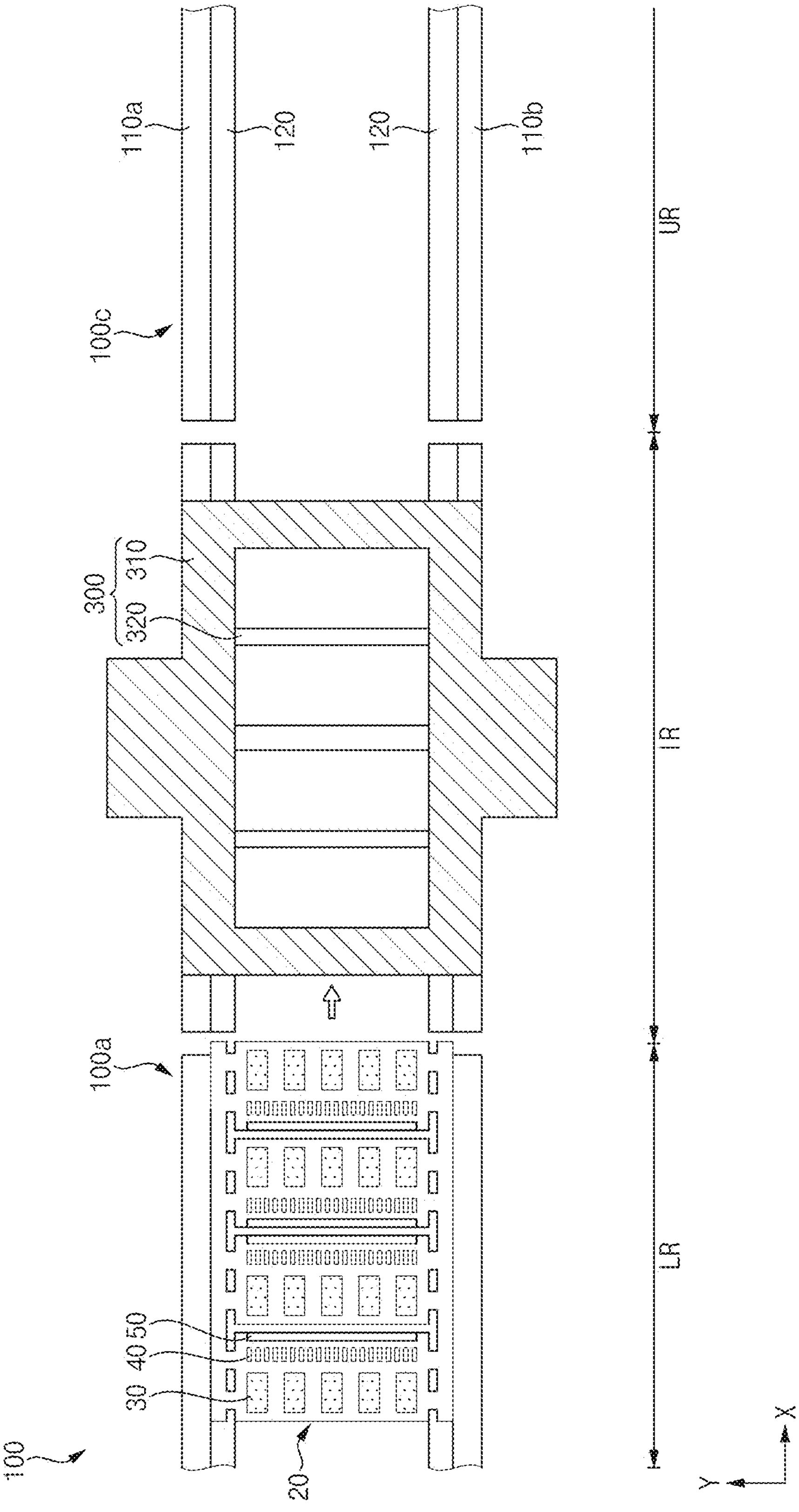
Figure 15:
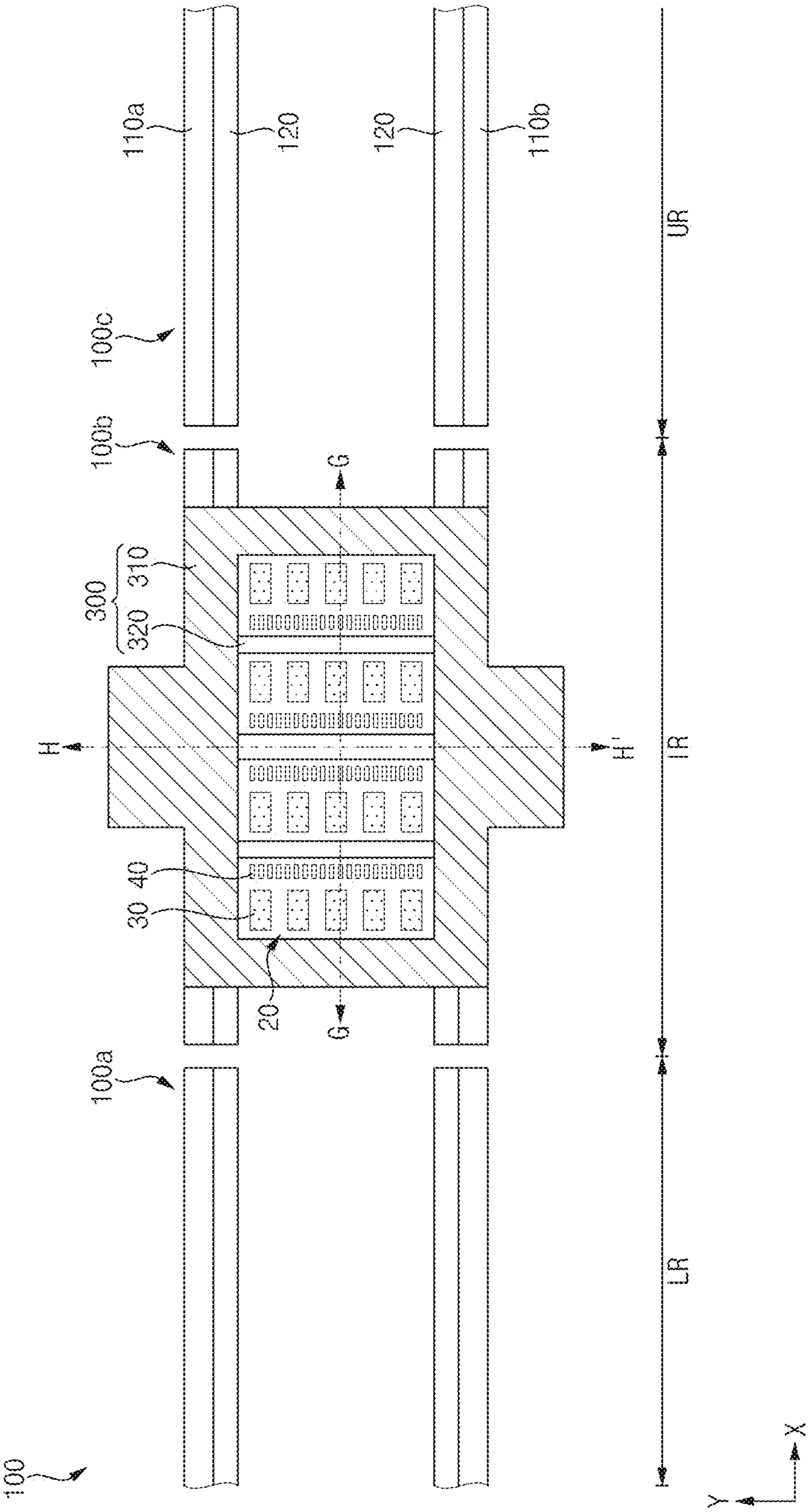
Figure 16:
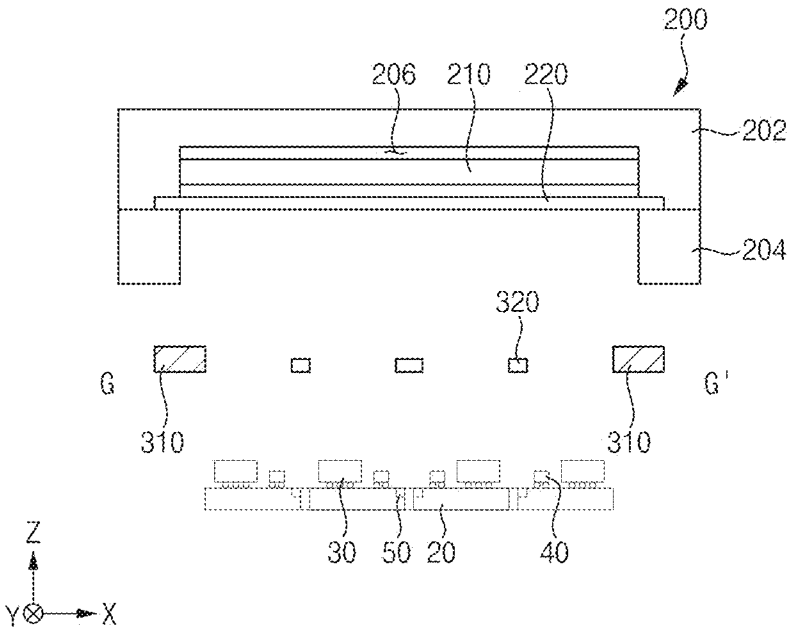
Figure 17:
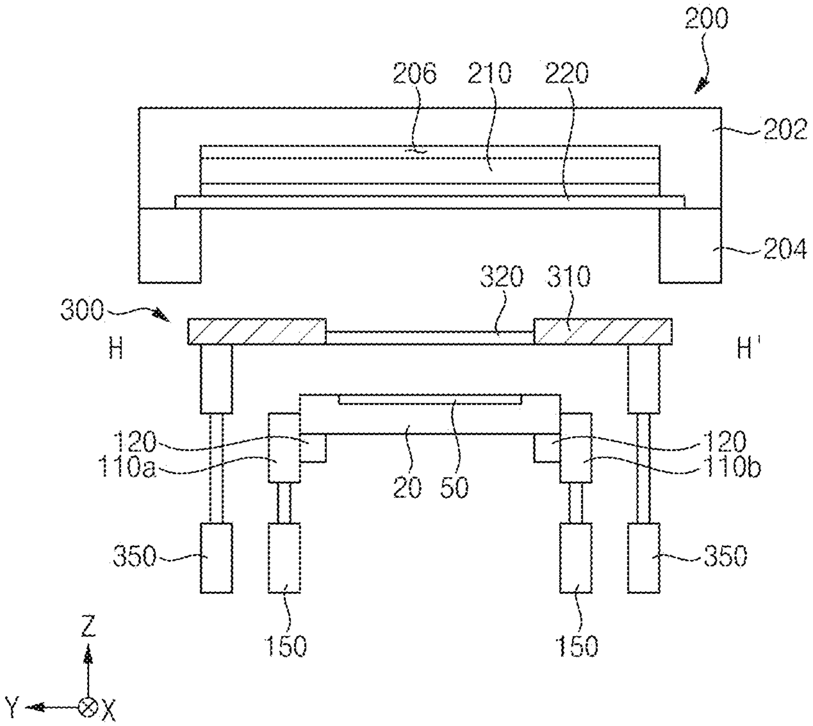
Figure 18:
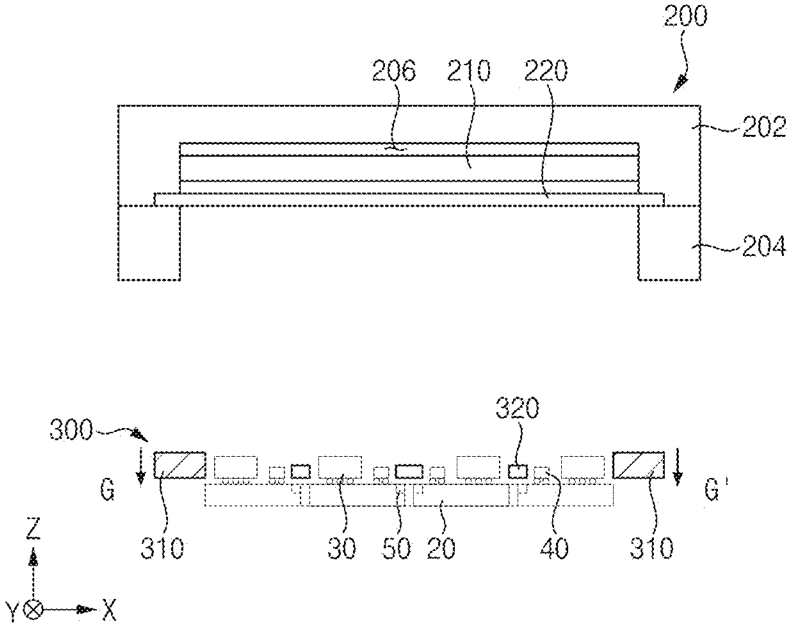
Figure 19:
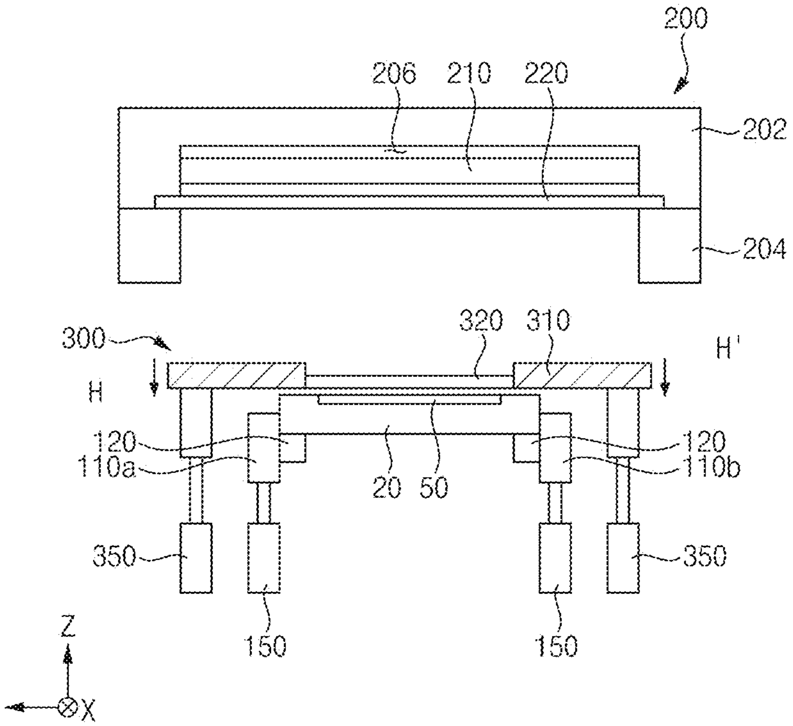
Figure 20:
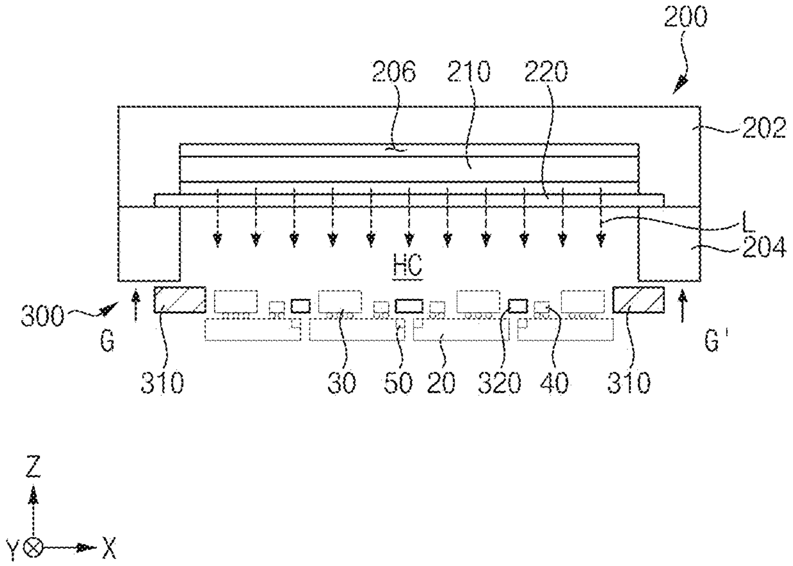
Figure 21:
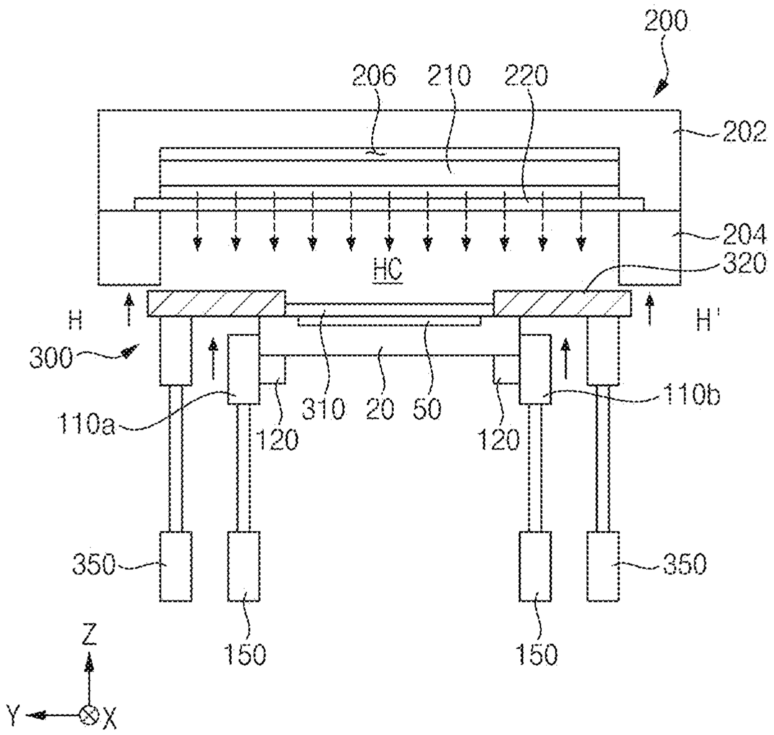
Figure 22:
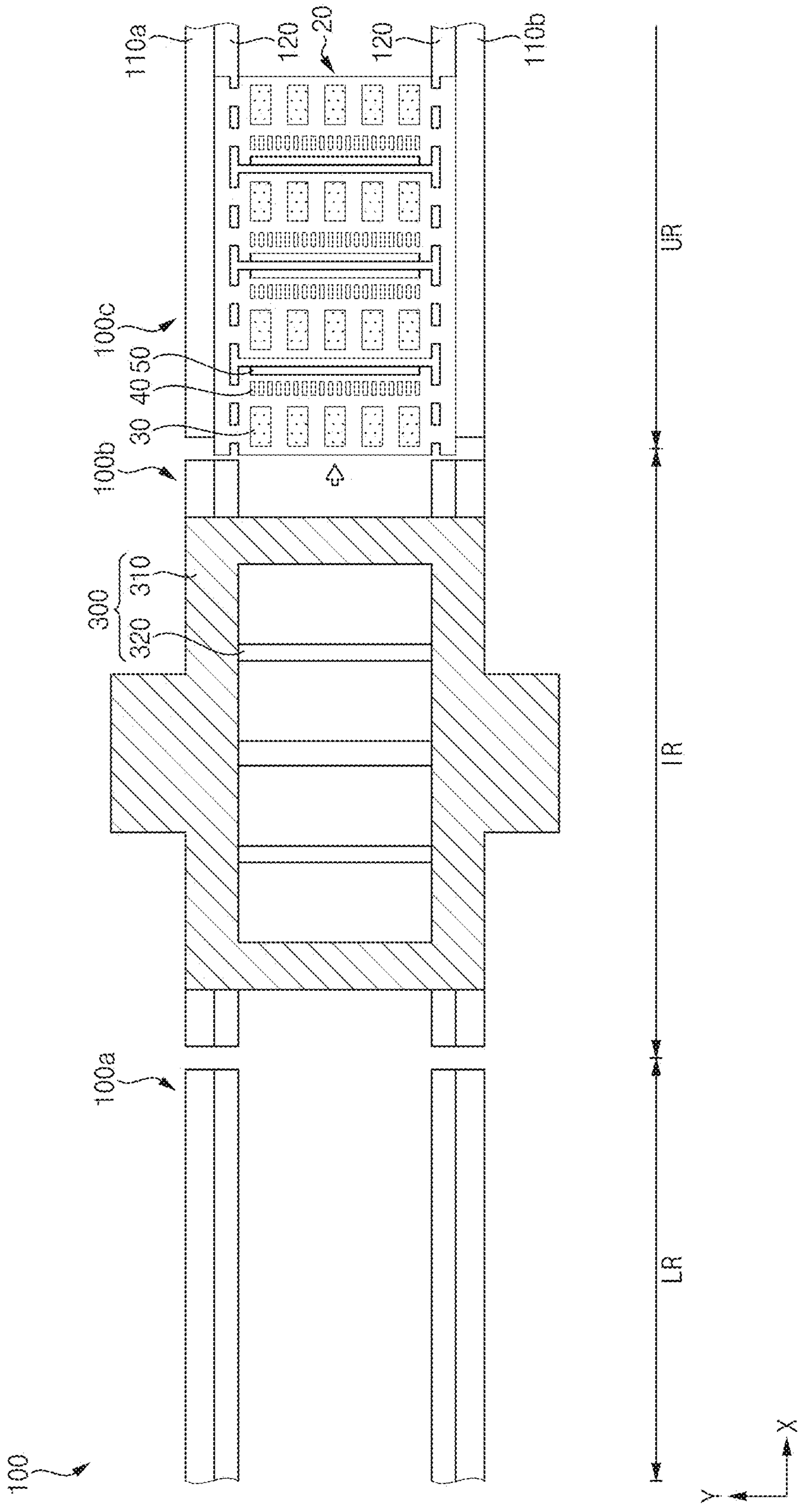

FIGS. 14 to 22 are views illustrating a method of manufacturing an electronic device, according to some example embodiments. FIG. 14 is a plan view illustrating a module array substrate in a loading region. FIG. 15 is a plan view illustrating a module array substrate in an irradiation region. FIGS. 16, 18, and 20 include cross-sectional portions taken along the G-G' line in FIG. 15. FIGS. 17, 19, and 21 include cross-sectional portions taken along the H-H' line in FIG. 16. FIG. 22 is a plan view illustrating a module array substrate in an unloading region.

Referring to FIG. 14, a module array substrate 20 may be loaded or arranged on a loading region LR of a substrate support 100.

In some example embodiments, the module array substrate 20 may include a plurality of module regions MR and a cutting region CR dividing the module regions MR, and the module array substrate 20 may be loaded onto a first transfer portion 100*a* of the substrate support 100. The module array substrate 20 may be placed on transfer conveyors 120 of the first transfer portion 100*a*.

A plurality of semiconductor devices 30, 40 may be disposed, placed, or arranged on the module array substrate 20. The first semiconductor device 30 may be disposed, placed, or arranged on the module array substrate 20 via conductive bumps 34. The second semiconductor device 40 may be disposed, placed, or arranged on the module array substrate 20 via a solder paste FL.

For example, the first semiconductor device 30 may include a logic chip or a memory device. The logic chip may be a controller that may control memory chips. The memory device may include volatile memory devices such as SRAM devices, DRAM devices, etc., and non-volatile memory devices such as flash memory devices, PRAM devices, MRAM devices, RRAM devices, etc.

The second semiconductor device 40 may include a passive element such as a capacitor or a resistor. For example, the second semiconductor device 40 may include a multi-layer ceramic capacitor (MLCC).

Referring to FIGS. 15 to 21, after the module array substrate 20 is transferred (or moved) to an irradiation region IR of the substrate support 100, a soldering process may be performed on the module array substrate 20.

As illustrated in FIGS. 15 to 17, the module array substrate 20 may be transferred from the first transfer portion 100*a* to the second transfer portion 100*b* within the irradiation region IR. A lamp heater 200 may be placed above the second transfer portion 100*b*, and a tab mask 300 may be placed on the second transfer portion 100*b* below the lamp heater 200.

When using the tab mask of FIG. 12, when the module array substrate 20 may be seated on the second transfer portion 100*b*, a right side of the module array substrate 20 may come into contact with a guide stopper 332. Accordingly, the module array substrate 20 seated on the second transfer portion 100*b* may be aligned by the guide stopper 332.

As illustrated in FIGS. 18 and 19, when the module array substrate 20 is seated on the second transfer portion 100*b*, the tab mask 300 may be lowered so that an edge portion 310 of the tab mask 300 may press (or contact) and fix (or couple to) a peripheral region of the module array substrate 20, for example, the cutting region CR. A guide pin 330 may be inserted into an alignment hole 24 formed in the cutting region CR of the module array substrate 20. Accordingly, the module array substrate 20 seated on the second transfer portion 100*b* may be aligned by the guide pin 330.

As illustrated in FIGS. 20 and 21, while the tab mask 300 presses (or contacts) the module array substrate 20, the module array substrate 20 and the tab mask 300 may be raised together, and the edge portion 310 of the tab mask 300 may come into contact with a light blocking partition 204 to form a heating chamber HC. Then, the lamp heater 200 may irradiate light L on the module array substrate 20 to heat the electronic components 30, 40. The transparent rib 320 of the tab mask 300 may cover or overlap a connector tab 50 of the module array substrate 20. A distance G between the transparent rib 320 and the corresponding connector tab 50 may be within a range of 0.1 mm (or about 0.1 mm) to 0.6 mm (or about 0.6 mm).

When heat is applied to the electronic component 30, 40 by the irradiation of light L, a flux component in the solder paste FL may react with a copper pad component to generate steam, and the relatively rapid evaporation of the water may cause the flux to splash onto the connector tab 50. Since the transparent rib 320 of the tab mask 300 may cover the connector tab 50, contamination of the connector tab 50 by the flux may be reduced, limited, or minimized.

In addition or alternatively, since the transparent rib 320 may transmit the light L, the connector tab 50 under the transparent rib 320 may also be heated by the light L. Accordingly, since the temperature of the connector tab 50 may also rise in a same or similar manner (or rate) as other substrate parts, it may be possible to reduce, limit, or minimize defects such as cold soldering due to thermal gradient and to reduce, limit, or minimize the vaporized flux from condensing on the connector tab 50 and contaminating the connector tab 50.

Referring to FIG. 22, when the soldering process is completed, the module array substrate 20 may be moved to an unloading region UR of the substrate support 100. The module array substrate 20 may be transferred (or moved) from the second transfer portion 100*b* to a third transfer portion 100*c* within the unloading region UR.

Then, the module array substrate 20 may be transferred to a sawing apparatus and then may be cut along the cutting region CR into individual semiconductor modules. For example, the semiconductor module may be a solid state drive (SSD) device that may function as a storage device.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

What is claimed is:

1. A soldering apparatus, comprising:

a substrate support configured to support a module array substrate, the module array substrate including a plurality of module regions having semiconductor devices arranged therein, each of the plurality of module regions having a connector tab in a side portion thereof;

a lamp heater above the substrate support and configured to irradiate light on the module array substrate; and a tab mask on the module array substrate, the tab mask including an edge portion having an opening that exposes the plurality of module regions of the module array substrate, and the tab mask including transparent ribs extending within the opening, each of the transparent ribs covering a corresponding connector tab and configured to transmit the light therethrough.

2. The soldering apparatus of claim 1, wherein the lamp heater includes a xenon (Xe) lamp that is configured to irradiate a pulsed light.

3. The soldering apparatus of claim 1, wherein the transparent ribs are spaced apart from the corresponding connector tabs.

4. The soldering apparatus of claim 3, wherein a distance between the transparent ribs and the corresponding connector tabs is within a range of 0.1 mm to 0.6 mm.

5. The soldering apparatus of claim 1, wherein the tab mask further includes an alignment guide member that extends in one direction from the edge portion and is configured to align the module array substrate.

6. The soldering apparatus of claim 1, wherein the transparent ribs include quartz, glass, or polyimide film.

7. The soldering apparatus of claim 1, further comprising:

a tab mask driver configured to support the tab mask, and raise and lower the tab mask.

8. The soldering apparatus of claim 1, wherein the substrate support includes:

a pair of guide rails extending in one direction; and conveyors extending along the pair of guide rails and configured to mount and transfer the module array substrate.

9. The soldering apparatus of claim 1, further comprising:

a light blocking partition in a lower portion of the lamp heater and configured to contact an upper surface of the tab mask to at least partially define a heating chamber for radiant heat transfer.

10. The soldering apparatus of claim 1, wherein the semiconductor devices include passive components adjacent to the connector tabs in each of the module regions of the module array substrate.

11. A soldering apparatus comprising:

a substrate support configured to support a module array substrate, the module array substrate including a plurality of module regions having semiconductor devices arranged therein and a cutting region dividing the plurality of module regions, and each of the plurality of module regions having a connector tab in a side portion thereof;

a lamp heater above the substrate support and configured to irradiate light on the module array substrate;

a tab mask on the module array substrate, the tab mask including an edge portion having an opening that exposes at least a portion of the module array substrate, and the tab mask including transparent ribs extending inwardly from the edge portion, each of the transparent ribs covering a corresponding connector tab and configured to transmit the light; and a tab mask driver configured to support the tab mask, and raise and lower the tab mask.

12. The soldering apparatus of claim 11, wherein the lamp heater includes a xenon (Xe) lamp that is configured to irradiate a pulsed light.

13. The soldering apparatus of claim 11, wherein the transparent ribs are spaced apart from the corresponding connector tabs.

14. The soldering apparatus of claim 13, wherein, when the lamp heater irradiates the light, a distance between the transparent ribs and the corresponding connector tabs is within a range of 0.1 mm to 0.6 mm.

15. The soldering apparatus of claim 11, wherein the tab mask further includes an alignment guide member that extends in one direction from the edge portion and is configured to align the module array substrate.

16. The soldering apparatus of claim 11, wherein the transparent ribs include quartz, glass, or a polyimide film.

17. The soldering apparatus of claim 11, wherein the edge portion includes a metal material.

18. The soldering apparatus of claim 11, wherein the substrate support includes:

a pair of guide rails extending in one direction; and conveyors extending along the pair of guide rails and configured to mount and transport the module array substrate.

19. The soldering apparatus of claim 11, further comprising:

a light blocking partition in a lower portion of the lamp heater and configured to contact an upper surface of the tab mask to at least partially define a heating chamber for radiant heat transfer.

20. A soldering apparatus, comprising:

a substrate support configured to support a module array substrate, the module array substrate including a plurality of module regions having semiconductor devices arranged therein and a cutting region dividing the plurality of module regions, each of plurality of module regions having a connector tab in a side portion thereof;

a lamp heater above the substrate support and configured to irradiate light on the module array substrate;

a tab mask on the module array substrate, the tab mask including an edge portion having an opening that exposes the module regions of the module array substrate, and the tab mask including transparent ribs extending within the opening, each of the transparent ribs covering a corresponding connector tab and configured to transmit the light;

a tab mask driver configured to support the tab mask, and raise and lower the tab mask; and a light blocking partition in a lower portion of the lamp heater and configured to contact an upper surface of the tab mask to at least partially define a heating chamber for radiant heat transfer.

* * * * *